US 8,086,358 B2

(12) United States Patent
O'Neil et al.

(10) Patent No.: US 8,086,358 B2
(45) Date of Patent: Dec. 27, 2011

(54) METHOD FOR PRE-HEATING HIGH POWER DEVICES TO ENABLE LOW TEMPERATURE START-UP AND OPERATION

(75) Inventors: Gary E. O'Neil, Raleigh, NC (US); Michael E. Stopford, Milton, VT (US); James B. Tate, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 11/776,353

(22) Filed: Jul. 11, 2007

(65) Prior Publication Data
US 2009/0018708 A1 Jan. 15, 2009

(51) Int. Cl.
G05D 23/00 (2006.01)
H03F 3/45 (2006.01)
H03F 3/14 (2006.01)
B41J 29/38 (2006.01)

(52) U.S. Cl. .......... 700/299; 347/17; 330/256; 330/307; 330/309

(58) Field of Classification Search .................. 330/256, 330/307, 309; 700/299; 347/17
See application file for complete search history.

(56) References Cited

U.S. PATENT DOCUMENTS

| 4,675,777 | A | * | 6/1987 | Watrous ......................... 361/106 |
| 5,324,916 | A | | 6/1994 | Goto et al. |
| 5,369,245 | A | | 11/1994 | Pickering |
| 5,774,331 | A | | 6/1998 | Sach |
| 5,911,897 | A | | 6/1999 | Hamilton |
| 6,046,433 | A | | 4/2000 | Gross et al. |
| 6,525,354 | B2 | * | 2/2003 | Masleid ......................... 257/288 |
| 6,621,055 | B2 | | 9/2003 | Weber et al. |
| 6,917,237 | B1 | * | 7/2005 | Tschanz et al. ................ 327/513 |
| 7,050,959 | B1 | * | 5/2006 | Pollard et al. ................... 703/21 |
| 2005/0268133 | A1 | | 12/2005 | Beard |

FOREIGN PATENT DOCUMENTS

| EP | 0540287 A2 | 10/1992 |
| JP | 05-029428 | 2/1993 |
| JP | 05-226440 | 9/1993 |
| JP | 05-235254 | 9/1993 |

OTHER PUBLICATIONS

Zurek et al., "Elevated Temperature Performance fo Pseudomorphic AlGaAs/InGaAs MODFET's" IEEE 1998 p. 2-8.*

* cited by examiner

*Primary Examiner* — Ryan Jarrett
*Assistant Examiner* — Thomas Stevens
(74) *Attorney, Agent, or Firm* — Yudell Isidore Ng Rusell PLLC

(57) ABSTRACT

A method and system for utilizing the heat dissipated by quiescent IC leakage currents to control the start-up temperature of components. A temperature control sub-system utilizes a thermal sensor to sense the junction temperature of the component. When the temperature is below an operating threshold, the control sub-system applies power to the component, and the component is self-heated due to the quiescent leakage current inherent to the component. This quiescent self-heating property serves as a source of pre-heat to elevate the temperature of the component, until the temperature, as indicated by the thermal sensor, rises above the minimum specified operating temperature of the component. The system may then be reliably initialized by applying full system power, and triggering a hardware reset or defined initialization sequence/procedure. Once the component(s) is operational, self-heating continues to maintain the component's temperature above the minimum operating threshold.

17 Claims, 4 Drawing Sheets

METHOD FOR PRE-HEATING HIGH POWER DEVICES TO ENABLE LOW TEMPERATURE START-UP AND OPERATION

RELATED APPLICATIONS

The present application is related to the subject matter of the following co-pending applications, filed concurrently herewith and similarly assigned. The content of the related applications are incorporated herein by reference:

Ser. No. 11/776,369 and titled "System for Extending the Operating Temperature Range of High Power Devices"; and Ser. No. 11/776,340 and titled "Utilization of Overvoltage and Overcurrent Compensation to Extend the Usable Operating Range of Electronic Devices."

BACKGROUND OF THE INVENTION

1. Technical Field

The present invention generally relates to electronic systems and in particular to temperature control in electronic systems. Still more particularly, the present invention relates to leakage currents and temperature control in electronic systems.

2. Description of the Related Art

Microprocessors and large scale application specific integrated circuits (ASICs) generally become unstable at low temperatures. These low temperatures limit the likelihood of reliable system startup, causing improper initialization and operation at cold temperatures. Existing solutions to mitigate this problem of improper initialization and ensure reliable operation at low temperatures essentially involves incorporating an ancillary heater attached to the ASIC. Ancillary heaters are employed and solely and/or mainly relied upon to pre-heat the entire system/device to a temperature within the device's prescribed operating limits.

As an alternative to ancillary heaters, system-level temperature compensation circuits and systems are employed to counteract and otherwise mitigate the effects of low temperature instabilities. However, these compensation circuits increase the complexity of the host systems, and in general are not as effective as ancillary heaters. As the host systems become more complex, cost, including additional implementation costs, inevitably increases.

SUMMARY OF THE INVENTION

Disclosed is a method and system for utilizing the heat dissipated by leakage currents inherent to integrated circuits (ICs) to enable attainment of a localized/junction temperature within an operating temperature range to enable system initialization and operation of components or devices at low temperatures. In particular, a temperature control sub-system utilizes an attached or embedded thermal sensor to sense the junction temperature of a non-operating microprocessor, ASIC or high power component. Upon the application of a power source, (for start up initalization), the component becomes self-heated due to the quiescent leakage current inherent with the component. This quiescent self-heating property serves to preheat or elevate the temperature of the component, until the temperature, as measured by a localized thermal sensor, rises above the minimum specified operating temperature of the component. The system may then be reliably initialized by applying full system power, and triggering a hardware reset or defined initialization sequence/procedure. Once the system is operational, self-heating continues to maintain the component's temperature at or above the minimum operating threshold.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method and system for monitoring and utilizing the heat dissipated by leakage currents of integrated circuits to enable attainment of a localized/junction temperature within an operating temperature range for high power devices. In particular, a temperature control sub-system utilizes an attached or embedded thermal sensor to sense the junction temperature of a non-operating microprocessor or ASIC (device). Upon the application of a power source (for start up initialization), the system becomes self-heated due to the quiescent leakage current inherent with the system's components. This quiescent self-heating property serves to pre-heat or elevate the temperature of the system, until the temperature, as measured by a localized thermal sensor, rises above the minimum specified operating temperature of the component. The system may then be reliably initialized by applying full system power and triggering a hardware reset or defined initialization sequence/procedure. Once the system is operational, self-heating continues to maintain the component's temperature at or above the minimum operating threshold.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

It is also understood that the use of specific parameter names are for example only and not meant to imply any limitations on the invention. The invention may thus be implemented with different nomenclature/terminology utilized to describe the above parameters, without limitation.

Figure 1:
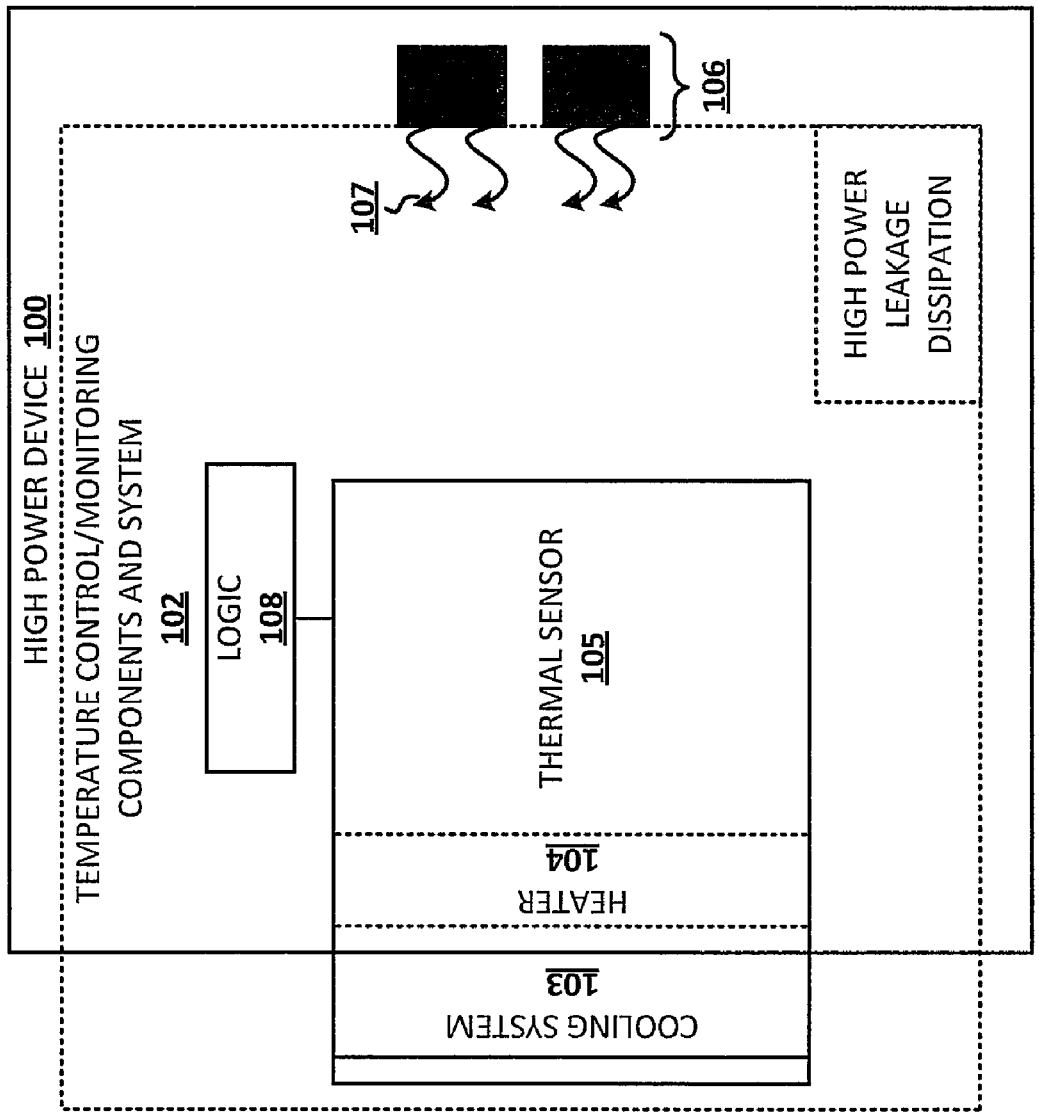
FIG. 1 depicts a system within which features of the invention may be advantageously implemented.

With reference now to the figures, FIG. 1 depicts a system within which features of the invention may be advantageously implemented. System 100 comprises temperature control sub-system 102. Temperature control sub-system 102 comprises the following elements: (1) Thermal sensor 105; (2) Cooling system 103; and (3) heater 104. System 100 also comprises component(s) (106) experiencing high levels of power dissipation (107), illustrated by high power component(s) 106. System 100 further comprises one or more components (and/or devices), which experience quiescence leakage current when the components (or devices) are either turned on but remain idle or not operational. For simplicity in explaining the illustrative embodiments, the components and/or devices that provide quiescent leakage currents and thus provide heat dissipation for self heating are collectively referred to as components and are illustrated as components 106.

These one or more components may comprise transistors or other integrated circuit components that exhibit the characteristics of generating heat dissipation due to leakage currents whenever power is applied to terminals of the components or devices, even when the components are themselves in an "off" (non-operational) mode. These components may be sub-components of high power components 106 and/or may also be (or be a part of) separate components within the overall system 100. Components 106 are responsible for quiescent self heating, which (self heating) is the result of power dissipation (107), and which may be due in part to leakage currents in components 106.

According to the illustrative embodiment, temperature control sub-system 102 completes a series of functional processes using the components 106 within system 100, including: (1) monitoring a temperature and a temperature change of components 106 relative to a lowest operational temperature of components 106; (2) analyzing temperature monitoring results to determine whether quiescent self heating at specific temperatures is sufficient to efficiently and singularly elevate the temperature of components 106; (3) utilizing the quiescent self heating properties of component(s) 106 without activating an ancillary heating source to maintain an operating temperature above the low operating temperature threshold; and other features/functionality described below and illustrated by FIGS. 2-3. As further illustrated, temperature control sub-system 102 may also include microcode 108 (or operational logic), which activates the second and third functional features above, prior to and during system operation.

In temperature control sub-system 102, cooling components/system 103 is essentially coupled to thermal sensor 105. Cooling system 103 may comprise a heat sink(s) and/or a cooling fan(s), for example. Thermal sensor 105 is also operationally coupled to components 106 of device 100. In one embodiment, thermal sensor 105 is an embedded thermal diode which measures the temperature of key components (among high power components 106) with reference to a low operational temperature threshold. The temperature detected by the thermal diode, i.e., the junction temperature, is determined by measuring a forward bias voltage of the diode which varies linearly with temperature.

Thermal sensor 105 functions as a reliable thermal monitor prior to and at system startup, since thermal sensor 105 is capable of accurately reflecting the stabilized (average) system ambient temperature. In addition, thermal sensor 105 provides a strategic monitor of maximum system operating temperature by virtue of the proximity of thermal sensor 105 to the high power (dissipating) components 106 within a host system (100). The illustrative embodiment is described with a thermal diode providing the functionality of the system's thermal sensor as a temperature monitor. Many other types of devices may be utilized to provide the temperature monitoring function described herein, including thermistors (temperature sensitive resistors), bimetallic thermocouples or thermostats, et al., and the specific use/description of a thermal diode as a temperature sensor is simply for illustration of the temperature monitoring function and not intended to be limiting on the invention.

Heater 104 is placed substantially adjacent to thermal sensor 105, as illustrated in system 100. Heater 104 is only utilized as a back-up heating source to the self heating process in the initialization (start up) procedure when the temperature of component(s) 106 within system 100 is below the lowest operational temperature of the component(s). Thus, heat generated by/from heater 104 may be occasionally combined with the heat generated by the device's quiescent self heating process to preheat device 100 (and specifically components 106) up to a lowest operational temperature in order to accelerate the system start up process.

Before system 100 becomes operational, the temperature of components 106 is raised to an operational temperature level. The self heating process resulting from leakage currents inherent to ICs is exploited in order to raise the temperature to an operational level. Once components 106 attain operational temperature levels, system power is applied and an initialization procedure commences, which concludes when the device becomes operational. When the device becomes operational, the self heating process continues and may be singularly used to maintain the device temperature above the lowest operational temperature.

The actual locations/positions of the above described components may vary relative to each other, and the illustrative embodiment is provided solely to illustrate one possible implementation and is not intended to limit the invention to the illustrated configuration.

Figure 2:
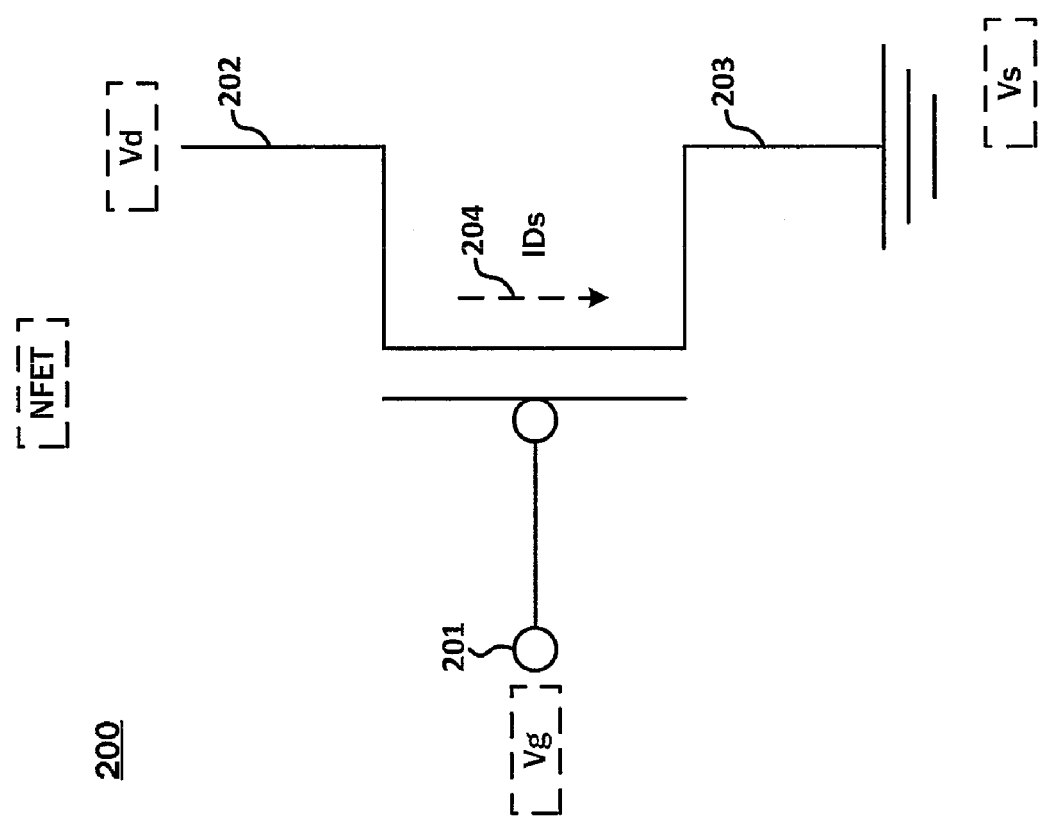
FIG. 2 depicts a negative field effect transistor (NFET) which illustrates the generation of leakage currents, according to an illustrative embodiment of the present invention.

FIG. 2 depicts a negative field effect transistor (NFET) which illustrates the generation of sub threshold leakage currents within an example component, according to an illustrative embodiment of the present invention. NFET 200 facilitates an explanation of the heating impact of leakage currents in semiconductor devices (e.g., components 106), which employ NFETs and other semiconductor devices as integrated circuit (IC) building blocks. These ICs may comprise millions of semiconductor devices.

NFET 200 comprises gate 201, source 203 and drain 202. A corresponding gate voltage (Vg) may be applied to gate 201. A source voltage (Vs) may be applied/connected to source 203, and a drain voltage (Vd) may be applied/connected to drain 202. When the voltage applied at the gate of NFET 200 is high, i.e., the voltage level representing a digital "1", NFET 200 is turned on and becomes operational. Alternatively, when the voltage applied at the gate of NFET 200 is low, i.e., the voltage level representing a "0", NFET 200 is turned off and becomes non-operational.

Because of small Metal Oxide Semiconductor Field Effect Transistor (MOSFET) geometries, these devices are ideally designed to accept voltages at the gate which voltages are small enough to allow the device to operate reliably. To maintain performance, the threshold voltage of the MOSFET is ideally small as well. As the threshold voltage is reduced, the transistor is incapable of being completely turned off; that is, the transistor operates in weak-inversion mode, with a sub-threshold leakage, or sub-threshold conduction, between source and drain. Thus, although NFET 200 may be turned off, a leakage current, for example, leakage current 204, still flows.

Large scale ASICs and microprocessors, even when nonfunctional, dissipate a significant amount of heat due to leakage paths inherent in the design. As microelectronic processes evolve, circuit geometries are reduced, leading to proportional increases in circuit density of ASIC and microprocessor designs. In addition, the reduced geometries and subsequent circuit densities result in shorter leakage paths in increasing numbers per unit of volume. Consequently, higher power densities are found within the devices, such as device 100, as the microelectronic processes continue to evolve. Furthermore, these high circuit density devices such as ASICs and microprocessors dissipate large amounts of heat due to the increased density of leakage paths within the device. The leakage paths exist and are independent of the device's functionality or performance.

The heat generated by the leakage current effectively heats the device, i.e., quiescent self heating takes place. The power dissipation due to leakage path losses is utilized as a heat source of opportunity, and, as a heat source, is applied for the purpose of self pre-heating the device. This quiescent self pre-heating feature mitigates or reduces the need for an ancillary pre-heat source which would otherwise be required to elevate the junction temperatures bto a temperature which places the device within a reliable operating temperature range.

Figure 3:
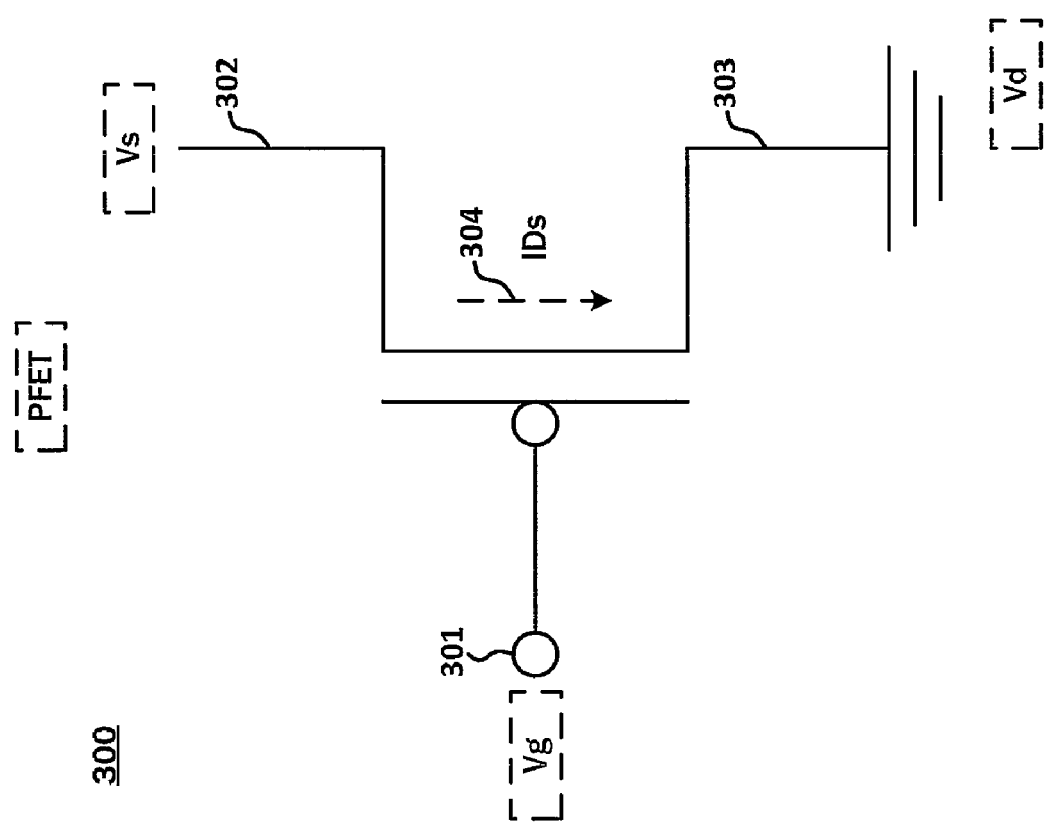
FIG. 3 depicts a positive field effect transistor (PFET) which illustrates the generation of leakage currents, according to an illustrative embodiment of the present invention.

FIG. 3 depicts a positive field effect transistor (PFET) which illustrates the generation of sub threshold leakage currents within another example component, according to an illustrative embodiment of the present invention. PFET 300 comprises gate 301, source 302 and drain 303. A corresponding gate voltage (Vg) may be applied to gate 301. A source voltage (Vs) may be applied/connected to source 302, and a drain voltage (Vd) may be applied/connected to drain 303. When the voltage applied at the gate of PFET 300 is low, i.e., the voltage level representing a digital "0", PFET 300 is turned on. Alternatively, when the voltage applied at the gate of PFET 300 is high, i.e., the voltage level representing a "1", PFET 300 is turned off. The digital high voltage level represents a voltage which is greater than the threshold voltage below which PFET 300 becomes operational. Thus, unlike NFET 200, PFET 300 is turned off when a digital 1 is applied to source 302. However, similar to NFET 200, leakage current 304 flows in PFET 300 when the device is turned off.

Microprocessors and large scale application specific integrated circuits (ASICs) comprise millions of semiconductor devices which, due to their usage in any given design are not all in an off state when power is applied and the device is quiescent or idle. Leakage current is increased significantly due to the contribution of those cases where the semiconductor devices are in an on state but nor operational (i.e., when idle), lending to the high increase in power dissipation with increasing circuit packaging densities.

Figure 4:
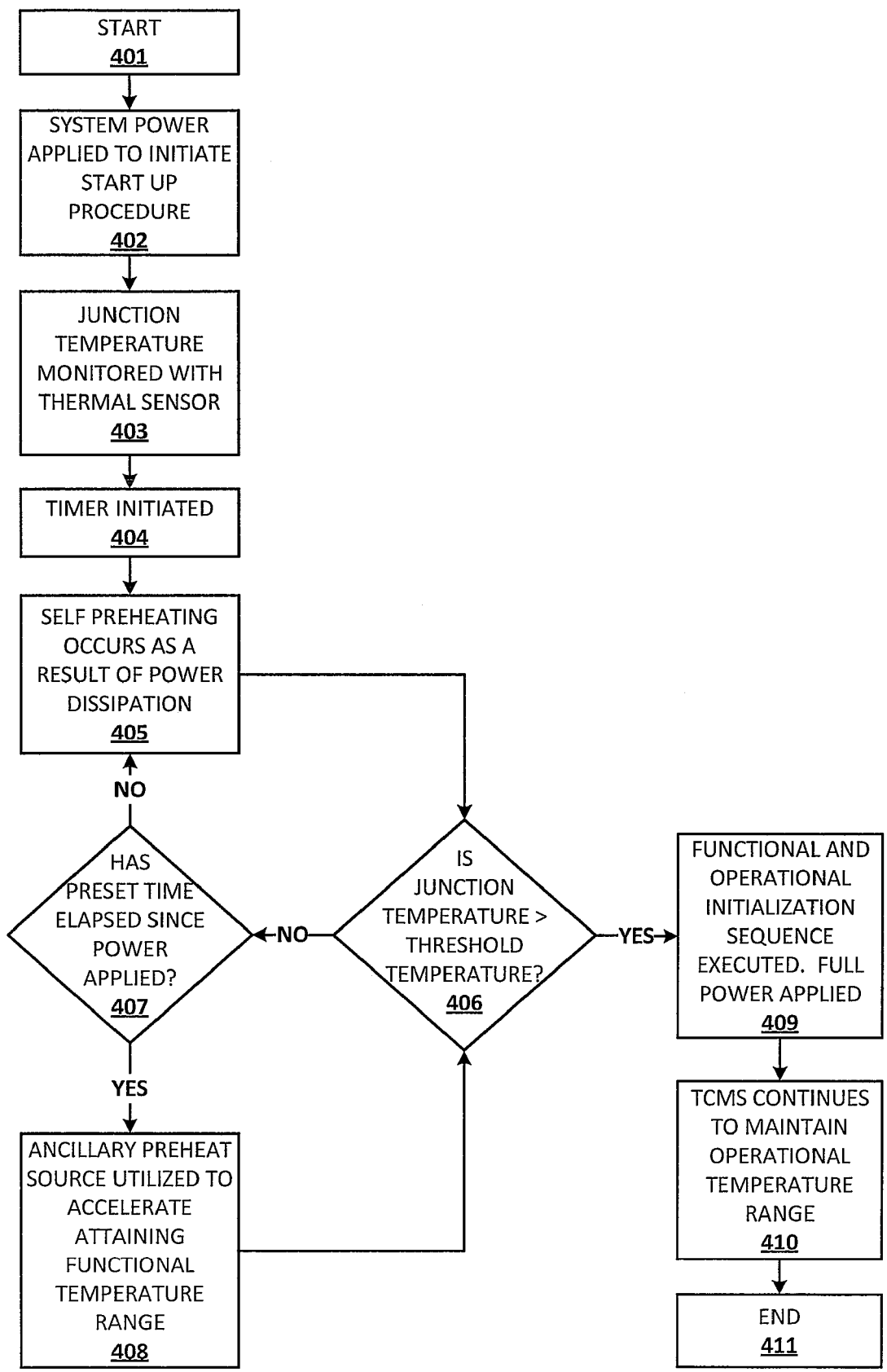
FIG. 4 illustrates the process of applying a quiescent self heating mechanism (without an ancillary heat source) to attain temperature levels within the operating temperature range of components or devices, according to an illustrative embodiment of the present invention.

FIG. 4 illustrates the process of applying a component's self heating mechanism (via quiescent self pre-heating without an ancillary heat source) to attain temperature levels within the operating temperature range according to an illustrative embodiment of the present invention. The process begins at block 401, and proceeds to block 402, at which a start up or power on procedure is initiated for some of the system's core components. In one embodiment, the start up procedure may involve activating a system start up button, for example. Alternatively, a pre-programmed facility may initiate the start up procedure.

At block 403, the junction temperature of an embedded (or attached) thermal sensor 105 is monitored to determine if the temperature is at or below the lowest operating temperature of the component(s) (106). The thermal sensor (105) does not require operation of the system to provide this implicit temperature measurement. The amount/level of voltage or current generated by the thermal sensor, which represents the lowest operating temperature of the component(s) is determined through characterization and/or calibration during or prior to a system design and/or final test. A comparator (threshold detector) switches (toggles) its output to indicate when the temperature of the component(s) crosses the lowest operating temperature threshold.

At block 404, a timer is initiated. The timer is used to indicate when a preset time has elapsed, in the event the (temperature elevating) impact of the quiescent self heating process is insufficient to reach the lowest operational temperature threshold within an allotted time. As leakage currents flow, quiescent self pre-heating begins to elevate the junction temperature of the component, as shown at block 405. The temperature control logic then determines, at block 406, whether the junction temperature measured by the thermal sensor is, at least, equal to the lowest operational threshold temperature of the component. If the junction temperature is less than the lowest operational threshold temperature of the device, the process moves to block 407, at which, a temperature control sub-system (102) determines whether the preset time for preheating the component(s) to an operational temperature has elapsed. If the junction temperature is greater than or equal to the lowest operational threshold temperature of the device, fall system power is applied, accompanied by an initialization procedure which concludes with the host device (or component) being operational, as shown at block 409. If at block 407 the preset time has elapsed, the component(s) is pre-heated utilizing an ancillary heat source (e.g., heater 104 in FIG. 1) in order to attain the lowest operational temperature, as shown at block 408. If at block 407 the preset time has not elapsed, quiescent self heating continues without the addition of an ancillary heat source, as shown at block 405.

In one embodiment, previous results from a particular design and/or system test focused on power dissipation may be utilized to determine the likelihood of success of quiescent self heating to elevate the temperature of a specified component in certain ambient conditions. An expected degree/amount of quiescent self heating may be derived from empirical/test data. The quiescent self heating impact may also be time/age-correlated to the device. Extreme ambient conditions may trigger the immediate activation of an ancillary heat source instead of waiting for the quiescent self heating process to elevate the temperatures over a substantially large range. Thus, results from previous tests may be utilized by a temperature control sub-system 102 to make decisions and trigger specific actions.

Returning to FIG. 4, once the system is operational, self heating due to the power dissipation of components within the system, continues without an ancillary heat source to maintain the temperature of the component within the operational temperature limits, as shown at block 410. The component(s)' temperature is continuously monitored by the thermal sensor (105) while the component is maintained operational in order to ensure that the component's temperature remains above the operational threshold. The process ends at block 411.

Thus, with the above embodiments, a system is provided having at least one component that operates within a temperature range having a lowest operating temperature. The system also has a temperature control subsystem having: (a) logic for detecting when a current temperature of the at least one component is below the lowest operating temperature; (b) logic for triggering dissipation of heat by applying activation power to devices within the system, which devices are prone to generate heat dissipation via quiescent leakage current. The activation power is applied prior to applying system power to, and initiating operation of, the at least one component, and enables the at least one component(s) 106 to be pre-heated to at or above the lowest operating temperature via the heat dissipation attributable to the quiescent leakage current; and (c) logic for enabling general system power to be applied to the at least one component and subsequent operation of the at least one component only when the temperature measured at the at least one component is at or above the lowest operating temperature.

In one embodiment, the devices to which activation power is applied may comprise one or more transistors, which are initially in the off state prior to application of general system power and which receives the activation power across terminals and yields a quiescent leakage current as a functional characteristic of the device.

More specifically, the logic for detecting comprises one or more thermal sensors that detects the current temperature of the at least one component, wherein the one or more thermal sensors are calibrated to detect and generate an output indicative of the current temperature of the component, including temperatures below the lowest operational temperature. Also, depending on the embodiment being implemented, the one or more thermal sensors may include at least one of: (a) one or more thermal diodes which produces a forward bias voltage which varies linearly with temperature, wherein the diode is positioned proximate to the component; and (b) one or more thermistors; (c) one or more bimetallic thermocouples; and one or more thermostats.

Additionally, the logic for triggering dissipation of heat further comprises at least one heater that is selectively activated to generate heat for increasing the current temperature of the at least one component when heat dissipation from leakage current and self heating is not sufficient to raise or maintain a measured temperature above the lowest operating temperature. The device also comprises logic for activating the heater when heat generated by leakage current heat dissipation does not elevate the current temperature of the at least one component above the lowest operational temperature within a preset time period following a system start-up procedure that applies power to the devices without turning the devices on. Then, when the detected temperature is at least equal to the lowest operational temperature threshold, the logic deactivates said heater to allow self heating by heat dissipation of operating components and devices to maintain the operational temperature. However, when the device is operational and self heating is unable to maintain an operational temperature, the logic automatically activates the heater to assist the self heating process in maintaining the operational temperature.

In one embodiment, a temperature control subsystem further comprises: logic for evaluating a current temperature against pre-set criteria; and logic for triggering activation of a selected one of multiple heating modes from among: (a) self heating without use of an ancillary heater, whereby heat dissipation from the devices and components is used as a singular heating source during system operation, without activating the ancillary heater to maintain the operating temperature within said operating temperature range; (b) self heating along with use of the ancillary heater when the self heating is not sufficient to maintain the temperature of the at least one component above the lowest operating temperature; and (c) combined heating via self heating and use of the ancillary heater to enable initialization of the at least one component, maintain operation of the at least one component once initialized, and to extend the operating temperature range of the at least one component below a normal lowest ambient temperature surrounding the system.

Finally, in one embodiment, a method is provided for pre-heating a host device with one or more components. The method comprises: initiating a timer when the system power is applied to trigger pre-heating via the quiescent leakage current; determining an elapsed time interval following initiation of the timer; monitoring an impact of heat dissipation caused by the quiescent leakage current on an increase in detected temperature within a pre-defined interval; and when the impact is less than a pre-set level of increased temperature of the device (or component) required within the pre-defined interval, activating an embedded heater to enhance the rate of temperature increase until the detected temperature is at or above the operational temperature.

While the invention has been particularly shown and described with reference to the illustrated embodiments, it will be understood by those skilled in the art that various changes in form and detail may be made therein without departing from the spirit and scope of the invention. For example, other mechanisms for detecting ambient heat other than the use of thermal diodes may be provided in alternate embodiments.

What is claimed is:

1. A system comprising:
at least one component that operates within a temperature range having a lowest operating temperature; and
a temperature control subsystem having:
logic for detecting when a current temperature of the at least one component(s) is below the lowest operating temperature; and
logic for triggering dissipation of heat by applying activation power to devices within the system, which devices are prone to generate heat dissipation via quiescent leakage current, prior to initiating operation of the at least one component, wherein the current temperature of the at least one component is pre-heated to at or above the lowest operating temperature via the quiescent leakage current heat dissipation before the at least one component is made operational; and
logic for enabling operation of the at least one component(s) only when a measured temperature of the at least one component(s) is at or above the lowest operating temperature.

2. The system of claim 1, wherein said logic for detecting comprises:
one or more thermal sensors that detects the current temperature of the at least one component, wherein the one or more thermal sensors are calibrated to detect and generate an output indicative of the current temperature of the at least one component, including temperatures below the lowest operational temperature; and
one or more thermal sensors that detects the current temperature of the at least one component, wherein the one or more thermal sensors do not require power be applied to the at least one component for monitoring the temperature of the at least one component.

3. The system of claim 2, wherein the one or more thermal sensors includes at least one of:
one or more thermal diodes which produces a forward bias voltage which varies linearly with temperature, wherein the one or more thermal diodes are positioned proximate to a key component; and one or more thermistors;
one or more bimetallic thermocouples; and
one or more thermostats.

4. The system of claim 1, wherein said logic for triggering dissipation of heat further comprises:
at least one heater that is selectively activated to generate heat for increasing the current temperature of the at least one component when heat dissipation from quiescent leakage current and component self heating is not sufficient to raise a measured temperature above the lowest operating temperature; and
logic for activating the heater when heat dissipation generated by quiescent leakage current does not elevate the current temperature of the at least one component above the lowest operational temperature within a preset time period following a system start-up procedure that applies power to the devices without turning the devices on;
wherein, when a detected temperature is at least equal to the lowest operational temperature threshold, said logic further deactivates said heater to allow self heating by heat dissipation of operating components and devices to maintain an operational temperature.

5. The system of claim 4 wherein:
when the device is operational and component self heating is unable to maintain an operational temperature, said logic automatically activates the heater to assist a self heating process in maintaining the operational temperature.

6. The system of claim 1, wherein said temperature control subsystem further comprises:
logic for evaluating a current temperature against pre-set criteria; and
logic for triggering activation of a selected one of multiple heating modes from among: (a) self heating without use of an ancillary heater, wherein heat dissipation from the devices and components is used as a singular heating source during system operation, without activating the ancillary heater to maintain an operating temperature within said operating temperature range; (b) self heating along with use of an ancillary heater when the self heating is not sufficient to maintain the operating temperature of the at least one component above the lowest operating temperature; and (c) combined heating via self heating and use of an ancillary heater to enable extension of an operating temperature range of the system below a normal lowest ambient temperature of the system.

7. The system of claim 1, wherein said devices comprise one or more transistors which are initially in the off state prior to application of general system power to enable operation of the at least one component and which receives the activation power across terminals and yields a leakage current as a functional characteristic of the device.

8. A method for enabling pre-heating of an electronic device having at least one component that has an operating temperature range, including a lowest operating temperature, said method comprising:
monitoring a temperature of the electronic device relative to the lowest operating temperature of the one or more components;
triggering an application of activation power to one or more devices that exhibit leakage characteristics resulting in heat dissipation via quiescent leakage current, prior to applying system power to and initiating operation of the at least one component, wherein the temperature of the at least one component is heated to at or above the lowest operating temperature via the quiescent leakage current heat dissipation; and
enabling general system power to be applied to the at least one component(s) and subsequent operation of the at least one component only when a measured temperature of the at least one component is at or above the lowest operating temperature.

9. The method of claim 8, wherein:
said monitoring is completed via one or more thermal sensors that detects a current temperature of the at least one component, wherein the one or more thermal sensors are calibrated to detect and generate an output indicative of the current temperature of the component, including temperatures below the lowest operational temperature; and
wherein the one or more thermal sensors includes at least one of:
one or more thermal diodes which produces a forward bias voltage which varies linearly with temperature, wherein the diode is positioned proximate to the at least one component;
one or more thermistors;
one or more bimetallic thermocouples; and
one or more thermostats.

10. The method of claim 8, wherein:
the device comprises at least one heater that is selectively activated to generate heat for increasing the current temperature of the at least one component when heat dissipation from quiescent leakage current and self heating is not sufficient to raise a measured temperature above the lowest operating temperature; and
said method further comprises:
automatically activating the heater when heat generated by quiescent leakage current heat dissipation does not elevate the current temperature of the at least one component above the lowest operating temperature within a preset time period following a system start-up procedure that applies power to the devices without turning the devices on; and
when detected temperature is at least equal to a lowest operational temperature threshold, deactivating said heater to allow self heating by heat dissipation of operating components and devices to maintain an operational temperature.

11. The method of claim 8, further comprising:
evaluating a current temperature against pre-set criteria; and
triggering activation of a selected one of multiple heating modes from among: (a) self heating without use of an ancillary heater, wherein heat dissipation from the devices and components is used as a singular heating source during system operation, without activating the ancillary heater to maintain the operating temperature within said operating temperature range; (b) self heating along with use of an ancillary heater when the self heating is not sufficient to maintain the temperature of the at least one component above the lowest operating temperature; and (c) combined heating via self heating and use of an ancillary heater to enable extension of the operating temperature range of the electronic device below a normal lowest ambient temperature of the electronic device.

12. The method of claim 8, wherein said electronic device includes an embedded heat source and said method further comprises:

when quiescent self pre-heating does not elevate a detected temperature in a preset interval following a system start up procedure and the temperature of the at least one component remains less than a lowest operational temperature threshold of the at least one component, activating the embedded heat source to preheat the at least one component.

13. A method comprising:

monitoring a temperature of one or more components within a system relative to a lowest operational temperature threshold for the components;

applying an activation power to devices within the system to begin an initialization of a self heating of the one or more components via quiescent leakage current from the devices; and determining whether only the self heating process is required to preheat a host device to the lowest operational temperature threshold of the device when the temperature of the device is below the lowest operational temperature threshold; and enabling operation of the one or more components when the temperature of the one or more components is at or above the lowest operational temperature threshold.

14. The method of claim 13, wherein said monitoring is completed using a thermal diode, said method further comprising comparing a forward bias voltage of the diode with a referenced preset forward bias voltage that represents the lowest operating temperature of the one or more components to determine a current temperature of the one or more components.

15. The method of claim 13, wherein said system includes an embedded heat source and said pre-heating further comprises when the temperature of the one or more components is less than the lowest operational temperature of the one or more components within a pre-set period following initial application of activation power to the devices, applying power to the embedded heat source to assist in pre-heating the one or more components.

16. The method of claim 13, wherein said applying further comprises:

executing an initialization procedure in which the system becomes operational when a current temperature of the one or more components reaches at or above the lowest operating temperature;

maintaining the temperature of the one or more components within the operational temperature limits utilizing self heating by the devices and one or more components and cooling via a cooling mechanism of the system; and when the temperature of the one or more components falls to within a pre-set range of the lowest operational temperature, selectively activating an embedded heating source to combine heat generated from the embedded heating source with the heat generated by self heating to maintain the temperature of the device within the operational temperature range.

17. The method of claim 13, wherein said applying further comprises:

initiating a timer when the activation power is applied to trigger pre-heating via the quiescent leakage current;

determining an elapsed time interval following initiation of the timer;

monitoring an impact of heat dissipation caused by the quiescent leakage current on an increase in detected temperature within a pre-defined interval; and when the impact is less than a pre-set level of increased temperature of the one or more components desired within the pre-defined interval, activating an embedded heater to enhance a rate of temperature increase until a detected temperature is at or above the operational temperature.

* * * * *